(12) United States Patent
Garay et al.

(10) Patent No.: US 11,154,956 B2
(45) Date of Patent: Oct. 26, 2021

(54) METHOD OF REPAIRING TURBINE COMPONENT USING ULTRA-THIN PLATE

(71) Applicant: GENERAL ELECTRIC COMPANY, Schenectady, NY (US)

(72) Inventors: Gregory Terrence Garay, West Chester, OH (US); Mark Kevin Meyer, Cincinnati, OH (US); Douglas Gerard Konitzer, West Chester, OH (US); William Thomas Carter, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 144 days.

(21) Appl. No.: 15/439,643

(22) Filed: Feb. 22, 2017

(65) Prior Publication Data
US 2018/0236616 A1 Aug. 23, 2018

(51) Int. Cl.
*B23P 6/04* (2006.01)
*B23K 26/34* (2014.01)
(Continued)

(52) U.S. Cl.
CPC ............. *B23P 6/045* (2013.01); *B22F 5/009* (2013.01); *B22F 5/04* (2013.01); *B22F 7/062* (2013.01);
(Continued)

(58) Field of Classification Search
CPC .......... B23P 6/045; B23P 6/007; F01D 9/065; F01D 5/005; F01D 5/147; F01D 5/187;
(Continued)

(56) References Cited

U.S. PATENT DOCUMENTS 4,896,408 A * 1/1990 Fraser .................... B23P 15/04
29/889.1
5,160,822 A 11/1992 Aleshin
(Continued)

FOREIGN PATENT DOCUMENTS

CN 105408055 A 3/2016
DE 19649865 C1 2/1998
(Continued)

OTHER PUBLICATIONS

International Search Report and Written Opinion issued in connection with corresponding PCT Application No. PCT/US2018/013388 dated May 4, 2018.
(Continued)

*Primary Examiner* — Sarang Afzali
(74) *Attorney, Agent, or Firm* — Dinsmore & Shohl LLP

(57) ABSTRACT

Methods of manufacturing or repairing a turbine blade or vane are described. The airfoil portions of these turbine components are typically manufactured by casting in a ceramic mold, and a surface made up of the cast airfoil and at the least the ceramic core serves as a build surface for a subsequent process of additively manufacturing the tip portions. The build surface is created by removing a top portion of the airfoil and the core, or by placing an ultra-thin shim on top of the airfoil and the core. The overhang projected by the shim is subsequently removed. These methods are not limited to turbine engine applications, but can be applied to any metallic object that can benefit from casting and additive manufacturing processes. The present disclosure also relates to finished and intermediate products prepared by these methods.

18 Claims, 14 Drawing Sheets

(51) Int. Cl.

| | | |
|---|---|---|
| *F01D 5/00* | (2006.01) | |
| *B22F 5/04* | (2006.01) | |
| *B23P 6/00* | (2006.01) | |
| *B23K 20/22* | (2006.01) | |
| *B23K 35/02* | (2006.01) | |
| *F01D 5/14* | (2006.01) | |
| *C30B 29/66* | (2006.01) | |
| *C30B 13/24* | (2006.01) | |
| *B22F 7/06* | (2006.01) | |
| *B22F 7/08* | (2006.01) | |
| *B22F 5/00* | (2006.01) | |
| *C30B 29/52* | (2006.01) | |
| *C30B 29/60* | (2006.01) | |
| *B22F 10/20* | (2021.01) | |
| *B22F 3/105* | (2006.01) | |
| *B23K 26/0622* | (2014.01) | |
| *B23K 101/00* | (2006.01) | |
| *B23K 103/08* | (2006.01) | |
| *B23K 103/18* | (2006.01) | |
| *F01D 9/06* | (2006.01) | |
| *F01D 5/18* | (2006.01) | |
| *B22F 3/24* | (2006.01) | |

(52) U.S. Cl.
CPC ............... *B22F 7/08* (2013.01); *B22F 10/20* (2021.01); *B23K 20/22* (2013.01); *B23K 26/34* (2013.01); *B23K 35/0244* (2013.01); *B23P 6/007* (2013.01); *C30B 13/24* (2013.01); *C30B 29/52* (2013.01); *C30B 29/607* (2013.01); *C30B 29/66* (2013.01); *F01D 5/005* (2013.01); *F01D 5/147* (2013.01); *B22F 3/105* (2013.01); *B22F 2003/245* (2013.01); *B22F 2998/10* (2013.01); *B22F 2999/00* (2013.01); *B23K 26/0624* (2015.10); *B23K 2101/001* (2018.08); *B23K 2103/08* (2018.08); *B23K 2103/26* (2018.08); *F01D 5/187* (2013.01); *F01D 9/065* (2013.01); *F05D 2230/22* (2013.01); *F05D 2230/30* (2013.01); *F05D 2230/31* (2013.01); *F05D 2240/125* (2013.01); *F05D 2240/307* (2013.01)

(58) Field of Classification Search
CPC ............. F05D 2230/30; F05D 2230/22; F05D 2240/307; F05D 2240/125; F05D 2230/31; B23K 2101/001; B23K 2103/26; B23K 2103/08; B23K 26/0624; B23K 26/34; B23K 20/22; B23K 35/0244; B22F 3/105; B22F 5/04; Y10T 29/49318; Y10T 29/4932; Y10T 29/49336–29/49343; Y10T 29/49718; Y10T 29/49732; Y10T 29/49742; Y10T 29/49746

See application file for complete search history.

(56) References Cited

U.S. PATENT DOCUMENTS

| | | | | |
|---|---|---|---|---|
| 5,207,371 A * | 5/1993 | Prinz | ............... | B22F 3/008 228/125 |
| 5,304,039 A | 4/1994 | Corderman et al. | | |
| 5,553,370 A * | 9/1996 | Pepe | ............... | B23P 6/007 228/119 |
| 5,822,852 A * | 10/1998 | Bewlay | ............... | B22D 19/10 29/889.1 |
| 6,203,861 B1 * | 3/2001 | Kar | ............... | B33Y 10/00 427/554 |
| 6,215,093 B1 | 4/2001 | Meiners et al. | | |
| 6,238,187 B1 * | 5/2001 | Dulaney | ............... | B23P 6/005 416/223 R |
| 6,614,107 B2 | 9/2003 | Inoue et al. | | |
| 6,991,150 B2 * | 1/2006 | Sato | ............... | B23K 9/038 228/119 |
| 8,360,734 B2 * | 1/2013 | Rose | ............... | B23K 9/167 416/228 |
| 8,925,792 B1 | 1/2015 | Suzuki et al. | | |
| 9,064,671 B2 | 6/2015 | Ljungblad et al. | | |
| 9,186,757 B2 * | 11/2015 | Munshi | ............... | F01D 5/005 |
| 9,956,612 B1 | 5/2018 | Redding et al. | | |
| 10,022,794 B1 | 7/2018 | Redding et al. | | |
| 10,022,795 B1 | 7/2018 | Redding et al. | | |
| 2002/0029863 A1 | 3/2002 | Anderson et al. | | |
| 2003/0101587 A1 | 6/2003 | Rigney et al. | | |
| 2003/0139841 A1 | 7/2003 | DeCord, Jr. | | |
| 2003/0150092 A1 | 8/2003 | Corderman et al. | | |
| 2007/0267109 A1 | 11/2007 | Kelly et al. | | |
| 2008/0164001 A1 | 7/2008 | Morris et al. | | |
| 2009/0041587 A1 | 2/2009 | Konter et al. | | |
| 2010/0151145 A1 | 6/2010 | Richter et al. | | |
| 2010/0200189 A1 * | 8/2010 | Qi | ............... | B22F 3/105 164/492 |
| 2012/0234512 A1 | 9/2012 | Pickrell et al. | | |
| 2013/0071562 A1 | 3/2013 | Szuromi et al. | | |
| 2013/0101746 A1 * | 4/2013 | Keremes | ............... | B22F 3/1055 427/457 |
| 2013/0108460 A1 | 5/2013 | Szwedowicz et al. | | |
| 2013/0149126 A1 | 6/2013 | Herrera Celaya et al. | | |
| 2014/0241938 A1 | 8/2014 | Merrill et al. | | |
| 2014/0241983 A1 | 8/2014 | Merrill et al. | | |
| 2014/0373503 A1 | 12/2014 | Hanlon | | |
| 2015/0024660 A1 | 1/2015 | Mase | | |
| 2015/0034266 A1 | 2/2015 | Bruck et al. | | |
| 2015/0306657 A1 | 10/2015 | Frank | | |
| 2015/0314403 A1 * | 11/2015 | Bruck | ............... | B23K 37/0452 219/76.14 |
| 2016/0045982 A1 | 2/2016 | Stoodt et al. | | |
| 2016/0069184 A1 | 3/2016 | Ribic et al. | | |
| 2016/0084089 A1 * | 3/2016 | Blaney | ............... | B22F 5/04 415/115 |
| 2016/0144434 A1 | 5/2016 | Burd | | |
| 2016/0158889 A1 | 6/2016 | Carter et al. | | |
| 2016/0237827 A1 | 8/2016 | Campbell et al. | | |
| 2016/0339516 A1 | 11/2016 | Xu | | |
| 2017/0009584 A1 | 1/2017 | Cui et al. | | |
| 2017/0038312 A1 | 2/2017 | Auxier et al. | | |
| 2018/0161852 A1 | 6/2018 | McCarren et al. | | |
| 2018/0161854 A1 | 6/2018 | Deines et al. | | |
| 2018/0161855 A1 | 6/2018 | Deines et al. | | |
| 2018/0161856 A1 | 6/2018 | Yang et al. | | |
| 2018/0161857 A1 | 6/2018 | Garay et al. | | |
| 2018/0161858 A1 | 6/2018 | Garay et al. | | |
| 2018/0161859 A1 | 6/2018 | Garay et al. | | |
| 2018/0161866 A1 | 6/2018 | Deines et al. | | |
| 2018/0200962 A1 | 7/2018 | Redding et al. | | |
| 2018/0202293 A1 | 7/2018 | Joshi et al. | | |
| 2018/0236556 A1 | 8/2018 | Garay et al. | | |
| 2018/0236557 A1 | 8/2018 | Garay et al. | | |
| 2018/0236558 A1 | 8/2018 | Garay et al. | | |
| 2018/0236615 A1 | 8/2018 | Garay et al. | | |
| 2018/0238173 A1 | 8/2018 | Garay et al. | | |

FOREIGN PATENT DOCUMENTS

| | | |
|---|---|---|
| DE | 19649865 C1 | 2/1998 |
| DE | 102014220787 A1 | 4/2016 |
| EP | 2071124 B1 | 6/2009 |
| EP | 2366476 A1 | 9/2011 |
| EP | 2495397 A2 | 9/2012 |
| EP | 2942424 A2 | 11/2015 |
| EP | 2995410 A1 | 3/2016 |
| FR | 3037974 A1 | 12/2016 |
| JP | H06210433 A | 8/1994 |
| JP | 2005248958 A | 9/2005 |
| JP | 2011185129 A | 9/2011 |
| JP | 2014196735 A | 10/2014 |
| JP | 2016536516 A | 11/2016 |

(56) References Cited

FOREIGN PATENT DOCUMENTS

| WO | WO2015/009444 A1 | 1/2015 |
|---|---|---|
| WO | WO2015/119692 A2 | 8/2015 |
| WO | WO2018/156255 A1 | 8/2018 |
| WO | WO2018/156256 A1 | 8/2018 |

OTHER PUBLICATIONS

PCT International Search Report and Written Opinion Corresponding to Application No. PCT/US2018/013386 dated Apr. 27, 2018.
PCT International Search Report Corresponding to Application No. PCT/US2018/018274 dated May 31, 2018.
PCT International Written Opinion Corresponding to Application No. PCT/US2018/018274 dated May 31, 2018.
PCT International Search Report and Written Opinion Corresponding to Application No. PCT/US2018/018276 dated May 31, 2018.
PCT International Search Report and Written Opinion Corresponding to Application No. PCT/US2018/018277 dated May 31, 2018.
PCT International Written Opinion Corresponding to PCT Application No. PCT/US2018/014189 dated Jul. 2, 2018.
English Translation of Chinese office action for application 201880026659.0 dated Aug. 5, 2020 (14 pages).
English Translation of Chinese office action for application 201880026574.2 dated Nov. 6, 2020 (17 pages).
English Translation of Chinese office action for application 201880026590.1 dated Dec. 1, 2020 (18 pages).
European Extended Search Report for EP Application No. 18757104.7 dated Nov. 16, 2020 (7 pages).
European Extended Search Report for EP Application No. 18758285.3 dated Nov. 26, 2020 (11 pages).
English Translation of Japanese office action for application 2019-546040 dated Dec. 23, 2020 (4 pages).
English Translation of Japanese office action for application 2019-545942 dated Dec. 23, 2020 (4 pages).
English Translation of Japanese office action for application 2019-546034 dated Oct. 16, 2020 (5 pages).
English Translation of Japanese office action for application 2019-546039 dated Oct. 16, 2020 (8 pages).
English Translation of Japanese office action for application 2019-545949 dated Oct. 9, 2020 (9 pages).
English Translation of Japanese office action for application 2019-545941 dated Oct. 19, 2020 (4 pages).
European Extended Search Report for EP Application No. 18758399.2 dated Oct. 21, 2020 (9 pages).
European Extended Search Report for EP Application No. 18757603.8 dated Sep. 9, 2020 (12 pages).
European Extended Search Report for EP Application No. 18757605.3 dated Oct. 23, 2020 (7 pages).
European Extended Search Report for EP Application No. 18756847.2 dated Sep. 3, 2020 (8 pages).

* cited by examiner

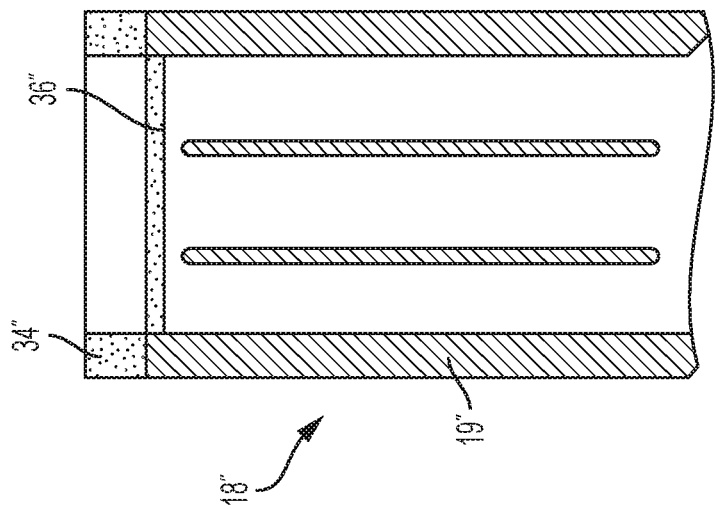
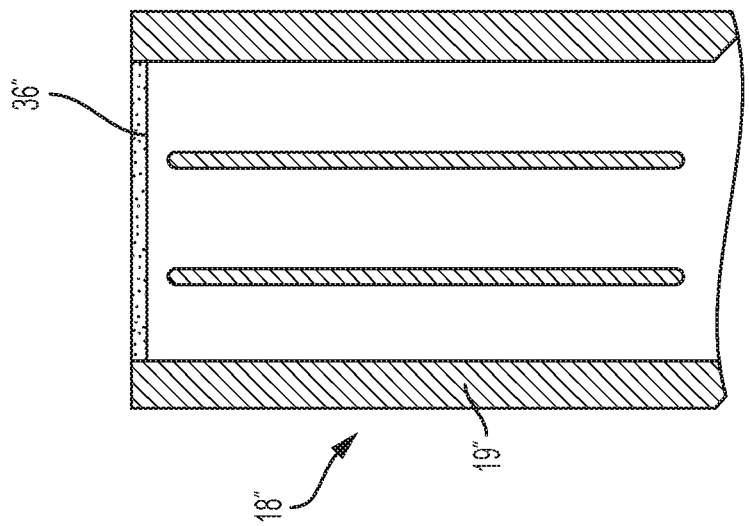
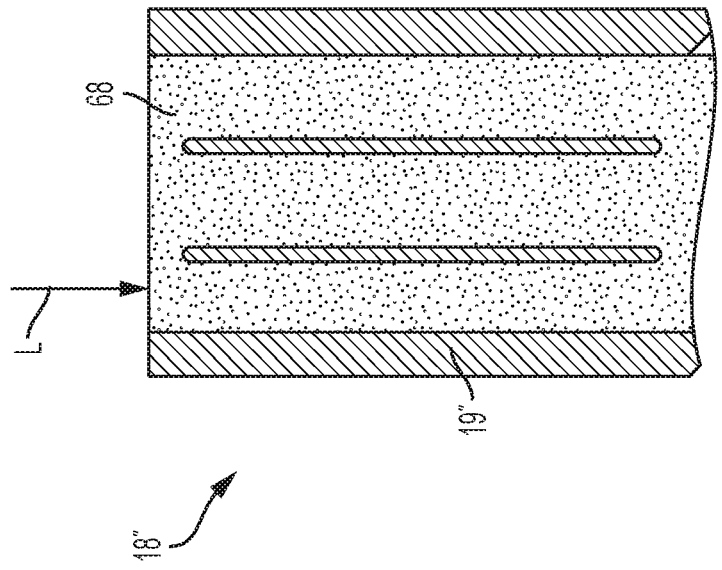

METHOD OF REPAIRING TURBINE COMPONENT USING ULTRA-THIN PLATE

INTRODUCTION

The present disclosure generally relates to a method of manufacturing or repairing a hollow metal object. More specifically, the hollow metal object is prepared using an additive manufacturing (AM) technique, or a mixture of an AM technique and of an investment casting technique. The AM technique utilized in the manufacturing method is not limited to the direct metal laser melting (DMLM) or any other laser powder-bed fusion additive manufacturing. The hollow metal object produced is especially useful as a component of an aircraft engine or other power generation turbines, e.g. a blade or a stator vane.

BACKGROUND

Superalloy materials are among the most difficult materials to weld due to their susceptibility to weld solidification cracking and strain age cracking. The term "superalloy" as used herein means a highly corrosion and oxidation resistant alloy with excellent mechanical strength and resistance to creep at high temperatures. Superalloys typically include high nickel or cobalt content. Examples of superalloys include alloys sold under the trademarks and brand names Hastelloy, Inconel alloys (e.g., IN 738, IN 792, IN 939), Rene alloys (e.g., Rene N5, Rene 80, Rene 142, Rene 195), Haynes alloys, Mar M, CM 247, CM 247 LC, C263, 718, X-750, ECY 768, 282, X45, PWA 1483 and CMSX (e.g. CMSX-4) single crystal alloys.

Gas turbine airfoils, both rotating blades and stationary vanes, are often manufactured by casting a superalloy material around a fugitive ceramic core that is then removed to form cooling chambers and channels in the blade. The manufacture of these turbine blades, typically from high strength, superalloy metal materials, involves an initial manufacture of a precision ceramic core to conform to the intricate cooling passages desired inside the turbine blade. A precision die or mold is also created which defines the precise 3-D external surface of the turbine blade including its airfoil, platform, and integral dovetail. A schematic view of such a mold structure 10 is shown in FIG. 1. The ceramic core 11 is assembled inside two die halves which form a space or void therebetween that defines the resulting metal portions of the blade. Wax is injected into the assembled dies to fill the void and surround the ceramic core encapsulated therein. The two die halves are split apart and removed from the molded wax. The molded wax has the precise configuration of the desired blade and is then coated with a ceramic material to form a surrounding ceramic shell 12. Then, the wax is melted and removed from the shell 12 leaving a corresponding void or space 13 between the ceramic shell 12 and the internal ceramic core 11 and tip plenum 14. Molten superalloy metal is then poured into the shell to fill the void therein and again encapsulate the ceramic core 11 and tip plenum 14 contained in the shell 12. The molten metal is cooled and solidifies, and then the external shell 12 and internal core 11 and tip plenum 14 are suitably removed leaving behind the desired metallic turbine blade in which the internal cooling passages are found. In order to provide a pathway for removing ceramic core material via a leaching process, a ball chute 15 and tip pins 16 are provided, which upon leaching form a ball chute and tip holes within the turbine blade that must subsequently be brazed shut.

U. S. Patent Application Publication No. 2010/0200189 (assigned to General Electric Company) discloses a method by which, as shown FIGS. 2A and 2B, the outer end of the airfoil 18 may be closed. In a first step, as shown in FIG. 2A, a tip plate 50 that precisely defines that shape of the cross section of the airfoil 18 is placed on the outer end of the airfoil 18 (without the ceramic casting mold), in contact with the outer wall 19. The tip plate 50 is bonded to the outer wall 19 by laser welding. Laser energy is then directed at the tip plate 50 from the end or the peripheral edges (see arrows "W" in FIG. 2A) so as to produce a through-weld and fuse the outer periphery of the tip plate 50 to the outer wall 19. Next, as shown in FIG. 2B, the tip wall 34 is formed through a freeform laser fabrication process where molten alloy powder is deposited on the tip plate 50 in one or more passes.

In another aspect, U.S. Patent Application Publication No. 2010/0200189 depicts an airfoil 18" formed by an alternative method. FIG. 3A illustrates the airfoil 18" in the as-cast condition (without the ceramic casting mold) with an outer wall 19". The interior of the airfoil 18" is filled with a suitable metallic alloy powder 68, which is scraped flush or otherwise leveled with the outer end of the outer wall 19". The powder 68 is sintered together and bonded to the outer wall 19" by directing laser energy at it, shown schematically at arrow "L" in FIG. 3A. FIG. 3B depicts the airfoil 18" after the powder 68 has been sintered into a completed tip cap 36" and the excess powder 68 removed. Once the tip cap 36" is formed, a tip wall 34" is formed on top of the tip cap 36" using a freeform laser fabrication process, as shown in FIG. 3C.

U. S. Patent Application Publication 2015/0034266A1 (assigned to Siemens Energy, Inc.) describes a method of manufacturing a turbine blade where the cavity of the blade is also filled with a support material for subsequent formation of the blade tip. As shown in FIG. 4, method 80 includes step 82 where a superalloy turbine blade is initially cast without a blade tip cap but with tip walls. At step 84, a supporting element is placed in a cavity of the blade. Then at step 86, an additive filler material comprising a metal powder is supported on the supporting element across the opening. Next at step 88, an energy beam is traversed across the additive filler material to melt the material and to thereby form a superalloy cap across the blade tip and is fused to the existing blade tip walls. The method 80 further comprises a step 90 of building a radially extending squealer ridge around the periphery of the cap via additive welding.

In view of the foregoing, and the fact that current blades and vanes tend to be life limited especially at their tips which are very expensive to replace, a need remains for novel methods of manufacturing tips or other components for new-make cast airfoils and field-return repair airfoils. It would be desirable to provide methods that are less time-consuming and more cost-effective. For example, it would be especially beneficial to provide methods that utilize materials that are already existing in airfoil manufacturing facilities and/or methods that find new, secondary uses for such materials, thereby circumventing the need to acquire and waste any new materials.

SUMMARY

In a first aspect, the present invention relates to a method of manufacturing a metal object. The method comprises: (a) placing a plate on top of a cast component, wherein the plate covers a cavity within the cast component and creates an overhang on top of the cast component; (b) depositing a layer of metallic powder onto the plate; (c) irradiating at least a portion of the metallic powder to form a fused layer; and (d) repeating steps (b)-(c) until the metal object is formed; and (e) removing the overhang.

Preferably the layer of metallic powder is deposited onto a planar surface of the plate.

In one of more embodiments, the plate has a thickness of 25-900 μm.

In one embodiment, the method is a process of repairing the metal object.

In one embodiment, steps (c)-(e) of the method are carried out in the presence of induction heating, radiant heating or a combination of both.

In certain embodiments, the method further comprises joining the plate to the cast component.

Preferably, the metal object is a turbine component. Preferably the turbine component is a blade. Alternatively, the turbine component is a vane.

Preferably, the cast component is an airfoil.

In some embodiments, the overhang is removed by machining.

In a second aspect, the present invention relates to a method of manufacturing a turbine blade or vane.

BRIEF DESCRIPTION OF THE DRAWINGS

FIGS. 3A, 3B and 3C are schematic diagrams showing another prior art method of manufacturing a blade tip where an as-cast airfoil (ceramic casting mold removed) has its hollow interior filled with a metallic alloy powder until the powder is leveled with the outerend of the outer wall, sintered to form a tip cap, then the tip wall is built upon the tip cap.

DETAILED DESCRIPTION

Figure 1:
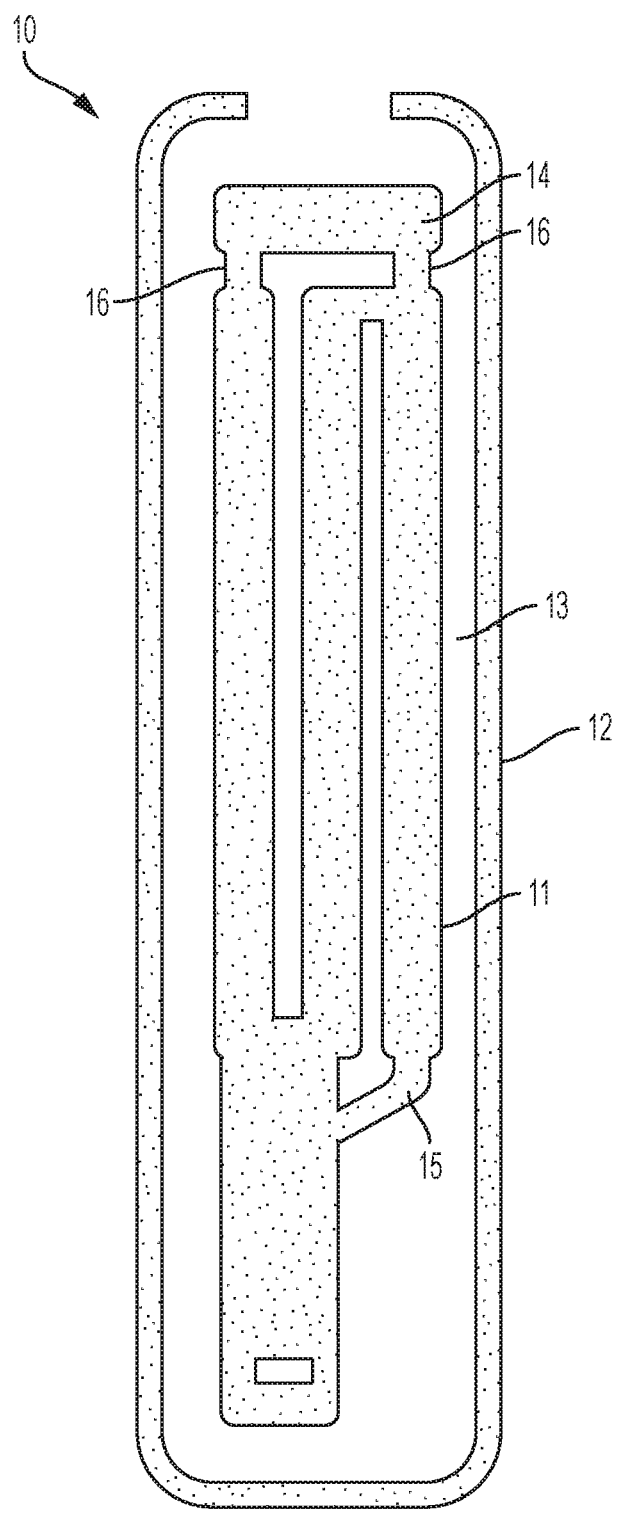
FIG. 1 is a schematic diagram showing an example of a conventional scheme for a core-shell mold with ball chute prepared by a conventional investment casting process.
Figure 2A:
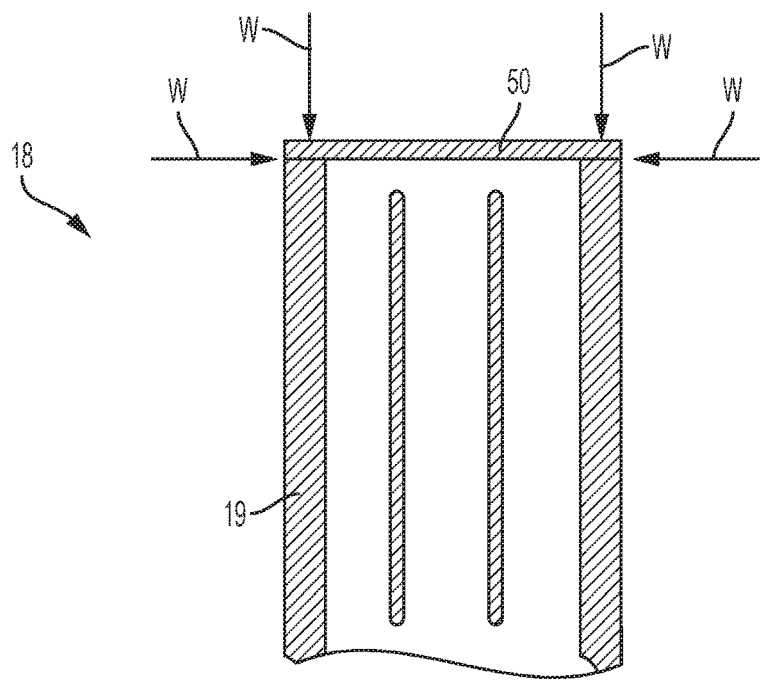
FIGS. 2A and 2B are schematic diagrams showing a prior art method of manufacturing a blade tip where a tip plate is added to an as-cast airfoil (ceramic casting mold removed) the tip wall is built upon the tip plate.
Figure 2B:
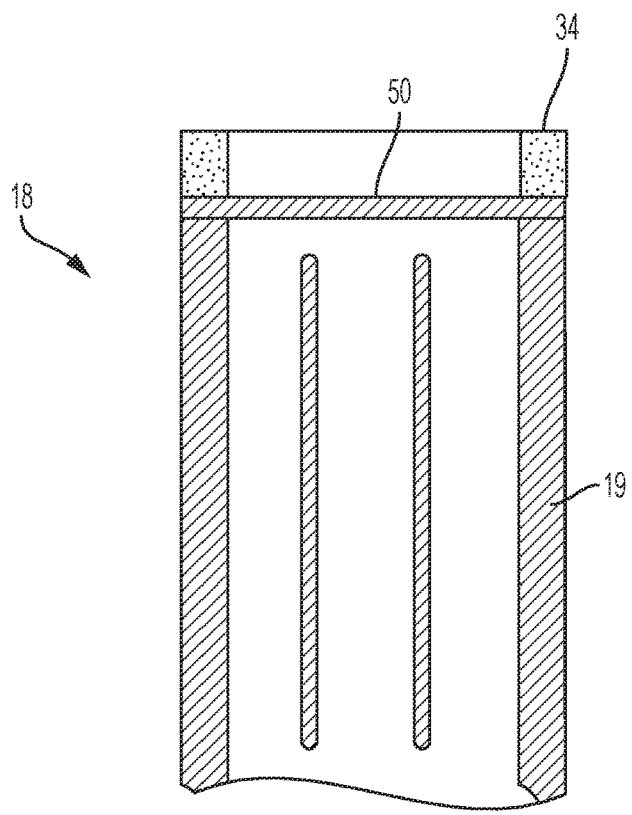
Figure 4:
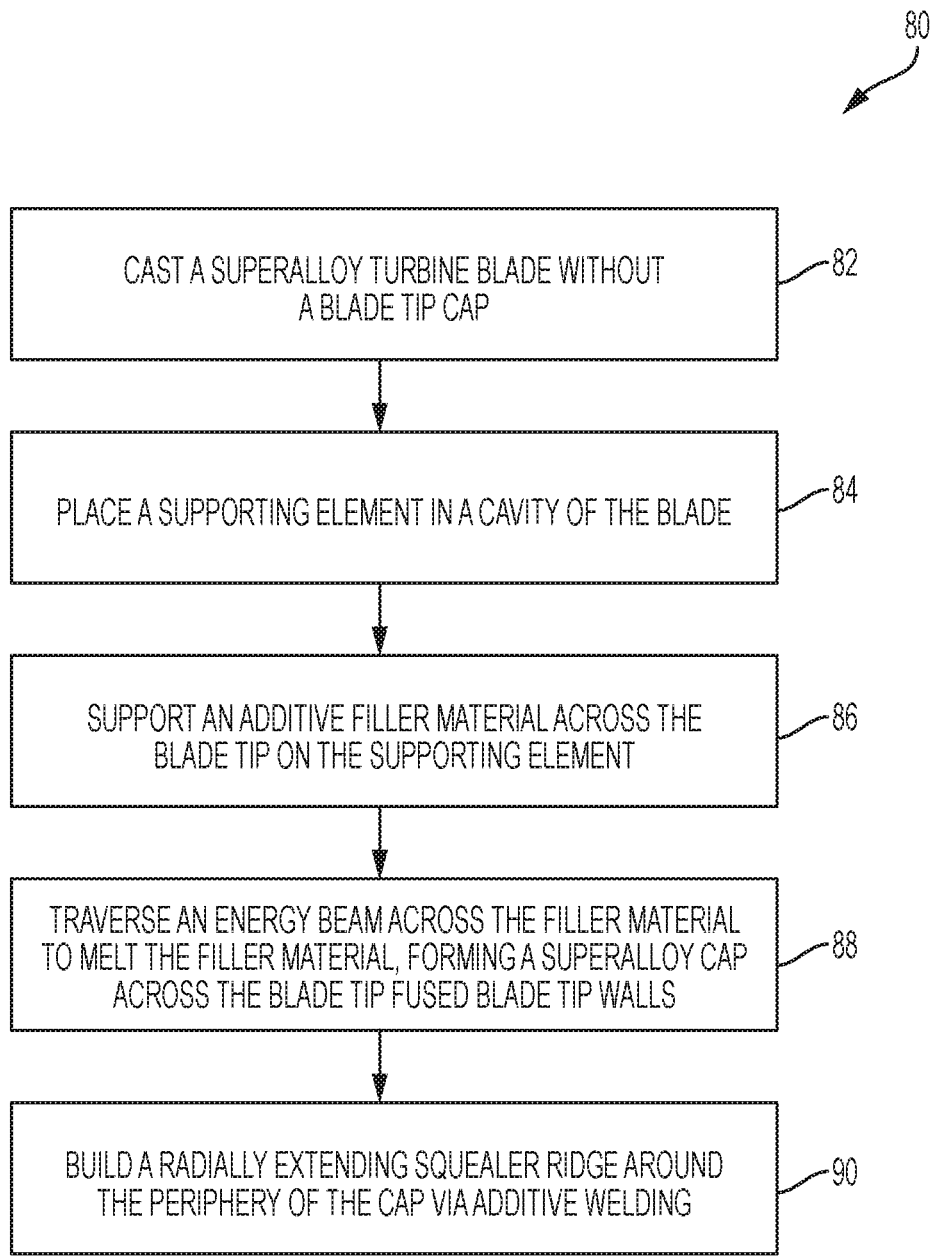
FIG. 4 is a flowchart depicting yet another prior art method of a blade tip where an as-cast airfoil (without the ceramic casting mold) has its hollow interior filled with a supporting element followed by an additive filler material across the blade tip. An energy is applied across the additive filler material to melt the material to form a superalloy cap across the blade tip and is fused to the existing blade tip walls.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. For example, the present invention provides a preferred method for additively manufacturing certain components of metal objects, and preferably these components and these objects are used in the manufacture of jet aircraft engines. Specifically, the production of single crystal, nickel-based superalloy or elemental titanium hollow metal objects such as turbine blades and stator vanes can be advantageously produced in accordance with this invention. However, other metal components of the turbine may be prepared using the techniques and methods described herein. Similarly, other suitable, non-turbine components may also be prepared using the techniques and methods provided herein.

As established in the background, it is known that the tip portion of a blade or a stator vane can be manufactured, subsequent to casting of the airfoil and other portions (e.g. blade root and vane trunnions), by a direct metal laser melting (DMLM) or an electron beam melting (EBM) process such as the EBM processes described in U.S. Pat. No. 9,064,671 (assigned to Arcam AB and incorporated herein by reference in its entirety).

A description of a typical DMLM process is provided in German Patent No. DE 19649865, which is incorporated herein by reference in its entirety. Owing to the fact that DMLM process requires a build platform or surface for supporting fabrication of a desired part geometry, prior art methods have often required building of a custom-made tip plate or tip cap (i.e. precisely defining that shape of the cross section of the airfoil) to not only close off the hollow interior of the airfoil, but to also serve as the surface for the DMLM process.

Ceramic casting mold used in conventional investment casting processes has often been regarded as a fugitive material to be removed immediately after cooling and solidification of the poured liquid metal. The present inventors have discovered that the internal ceramic core and optionally the external shell can elegantly and conveniently serve as a support structure for subsequent DMLM formation of the tip or any other component of the blade or vane. As used herein, the term "fugitive" means removable after melting and cooling of the metal, for example by a mechanical process, by fluid flushing, by chemical leaching and/or by any other known process capable of removing the fugitive material from its position. In certain embodiments when working with field-return airfoils with damaged or worn-off tips, ceramic slurry can be injected into the hollow interior or inner cavity of the airfoils to re-form the ceramic core. The combined core and airfoil then offers a support surface for formation of a replacement tip by DMLM.

The use of the ceramic core as a support structure for subsequent additive manufacturing operations is not only cost- and time-effective, but also highly viable. This is because ceramic is chemically inert and has high strength, high fracture toughness, high elastic modulus hardness, high melting points, low thermal expansion, excellent wear resistance, etc. Such physicochemical properties make ceramic an ideal material to withstand the conditions (i.e. high temperature and high pressure) of additive manufacturing processes. Moreover, it is not difficult to remove the ceramic core after completion of the manufacturing process (i.e. casting and printing), for example by mechanical force or chemical leaching (e.g. in alkaline bath) or preferably a combination of both. The ceramic casting molds, cores, shells and slurries of the present invention are preferably composed of a photopolymerized ceramic, more preferably a cured photopolymerized ceramic.

Figure 5A:
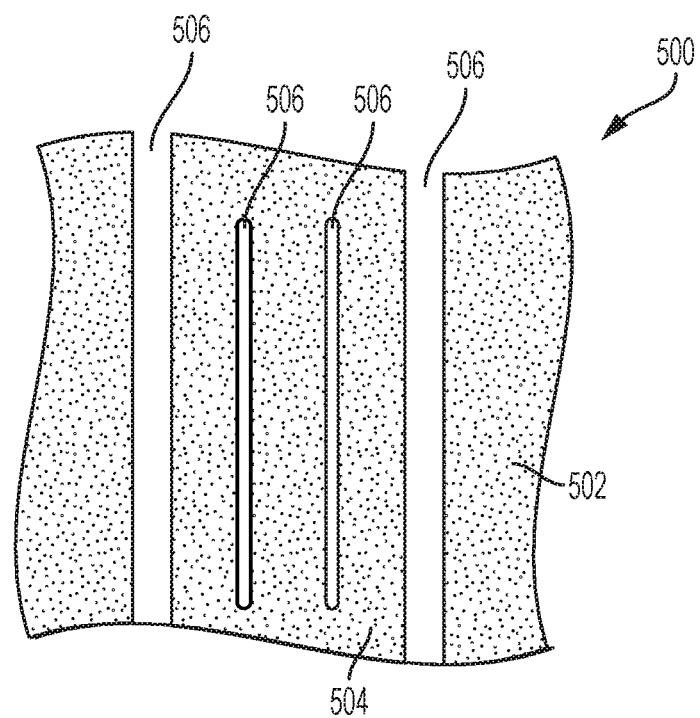
FIG. 5A shows a ceramic casting mold having an external shell and an internal core with one or more inner cavities between the shell and the core according to an embodiment of the invention.
Figure 5B:
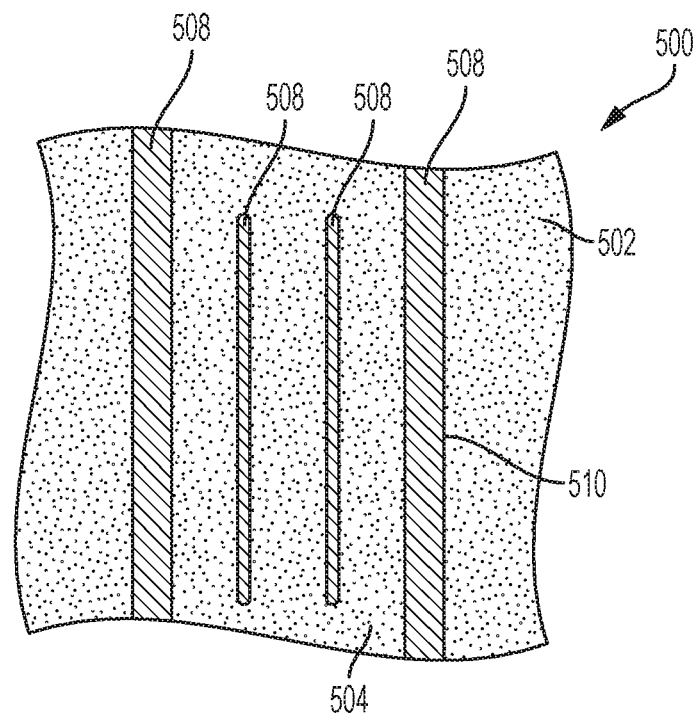
FIG. 5B shows the inner cavities of the ceramic casting mold of FIG. 5A being filled with a liquid metal to cast an airfoil.
Figure 5C:
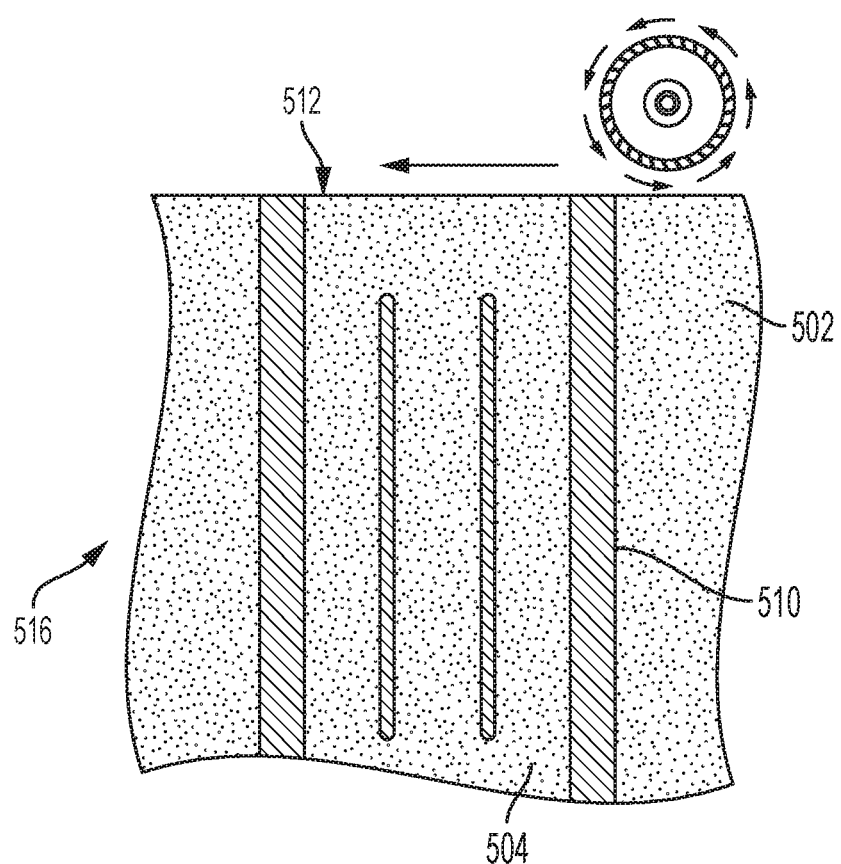
FIG. 5C shows a portion of the liquid metal-filled ceramic casting mold of FIG. 5B being ground to create a flat or planar surface.

FIGS. 5A-5D depict a method of manufacturing a new-cast turbine blade in accordance with the present invention. In the beginning, as shown in FIG. 5A, there is provided a ceramic casting mold 500 having an external shell 502 and an internal core 504. The cavities 506 are adapted to define the shape of the turbine blade upon casting and removal of the ceramic casting mold 500. During the casting process, as seen in FIG. 5B, a liquid metal 508 is poured in the cavities 506 and left to cool and solidify to form at least the airfoil component 510 of the turbine blade. In some embodiments, the root of the turbine blade or the inner and outer trunnions of a stator vane are also formed during casting (not shown). Next, as shown in FIG. 5C, a portion of the airfoil 510-ceramic casting mold 500 combination is removed, for example, by grinding, machining, cutting or other known techniques. FIG. 5C shows an embodiment where a grinder blade or disc is used remove the top portion of the airfoil 510-ceramic casting mold 500 combination. Consequently, a flat or planar surface 512 is revealed and the metal-ceramic intermediate 516 is produced. The planar surface 512 functions as a continuous and sealed support structure for the subsequent deposition of raw metallic powder in the DMLM process of manufacturing the tip component of the turbine blade shown in FIG. 5D.

The tip of a blade or a stator vane in accordance with the present invention includes a peripheral tip wall that is sometimes referred as a squealer tip and a tip cap that closes off the interior of the airfoil. In some embodiments, however, the tip cap may be eliminated leaving the airfoil with an open cavity.

At the initial stage of the DMLM process, the raw metallic powder deposited on the ceramic-metal build surface 512 is melted together and bonded to the outer wall of the airfoil 510 by directing laser energy at it. The exact process parameters may vary to suit a specific application. In one embodiment, a short pulsed infrared laser beam is used, with an average power of 1-100 W, pulse frequency of 1 Hz to 200 kHz. The translation speed or scanning speed, if the laser beam is used with a scanner, is approximately 5 mm/s (0.197 in./s) to about 500 mm/s (19.7 in./s).

Alternatively and preferably, the first additive layer of the tip is joined to the airfoil 510 using a method of bonding superalloys disclosed in U.S. Pat. No. 8,925,792 (assigned to General Electric Company), which is incorporated herein by reference in its entirety. The method generally includes aligning a first superalloy subcomponent having a gamma-prime solvus g'1 and a second superalloy subcomponent having a gamma-prime solvus g'2, with a filler material that includes at least 1.5 wt % boron disposed between the first and second superalloy subcomponents; performing a first heat treatment at a temperature T1, where T1 is above the solidus of the filler material and below the liquidus of the filler material; and performing a second heat treatment at a temperature T2, where T2 is greater than T1, and where T2 is greater than or equal to the lower of g'1 and g'2.

With proper control of the DMLM process parameters, this process can produce the same microstructure in the additively manufactured tip wall (e.g. directionally solidified or single crystal) as that of the airfoil 510, if desired. For example, a continuous wave beam of about 300 W to about 1000 W power may be used, with a traverse rate of about 0.25 cm/s (0.1 in./s) to about 0.76 cm/s (0.3 in./s) and preferably about 0.44 cm/s (0.175 in./s) to about 0.51 cm/s (0.200 in./s). About 100-200 passes result in a tip wall of a suitable height and a near-net shape, where each layer is 20-100 μm, preferably 20-50 μm, more preferably 30-50 μm. In one embodiment, each additive layer is 30 μm. As used herein, the term "near-net" refers to a structure that does require substantial additional machining processes in order to arrive at a finished part. Once the DMLM process is finished, the tip wall may be further formed by known processes of machining, grinding, coating, etc.

Representative examples of suitable materials for the raw metallic powder used during additive manufacturing and the liquid metal used during casting include alloys that have been engineered to have good oxidation resistance, known "superalloys" which have acceptable strength at the elevated temperatures of operation in a gas turbine engine, e.g. Hastelloy, Inconel alloys (e.g., IN 738, IN 792, IN 939), Rene alloys (e.g., Rene N4, Rene N5, Rene 80, Rene 142, Rene 195), Haynes alloys, Mar M, CM 247, CM 247 LC, C263, 718, X-750, ECY 768, 282, X45, PWA 1483 and CMSX (e.g. CMSX-4) single crystal alloys. The airfoils and the blade tips of the present invention may be formed with one or more selected crystalline microstructures, such as directionally solidified ("DS") or single-crystal ("SX"). In certain embodiments, the blades and vanes of the present invention may be formed with multiple, controlled metallic grain orientations, such as the microstructures disclosed in the Applicant's co-pending application Ser. No. 15/405,656, of which the disclosure is incorporated herein by reference in its entirety. In a particular embodiment, the airfoils of the present invention are formed with a single crystal structure but the blade tips are formed with a non-single crystal structure.

Figure 5D:
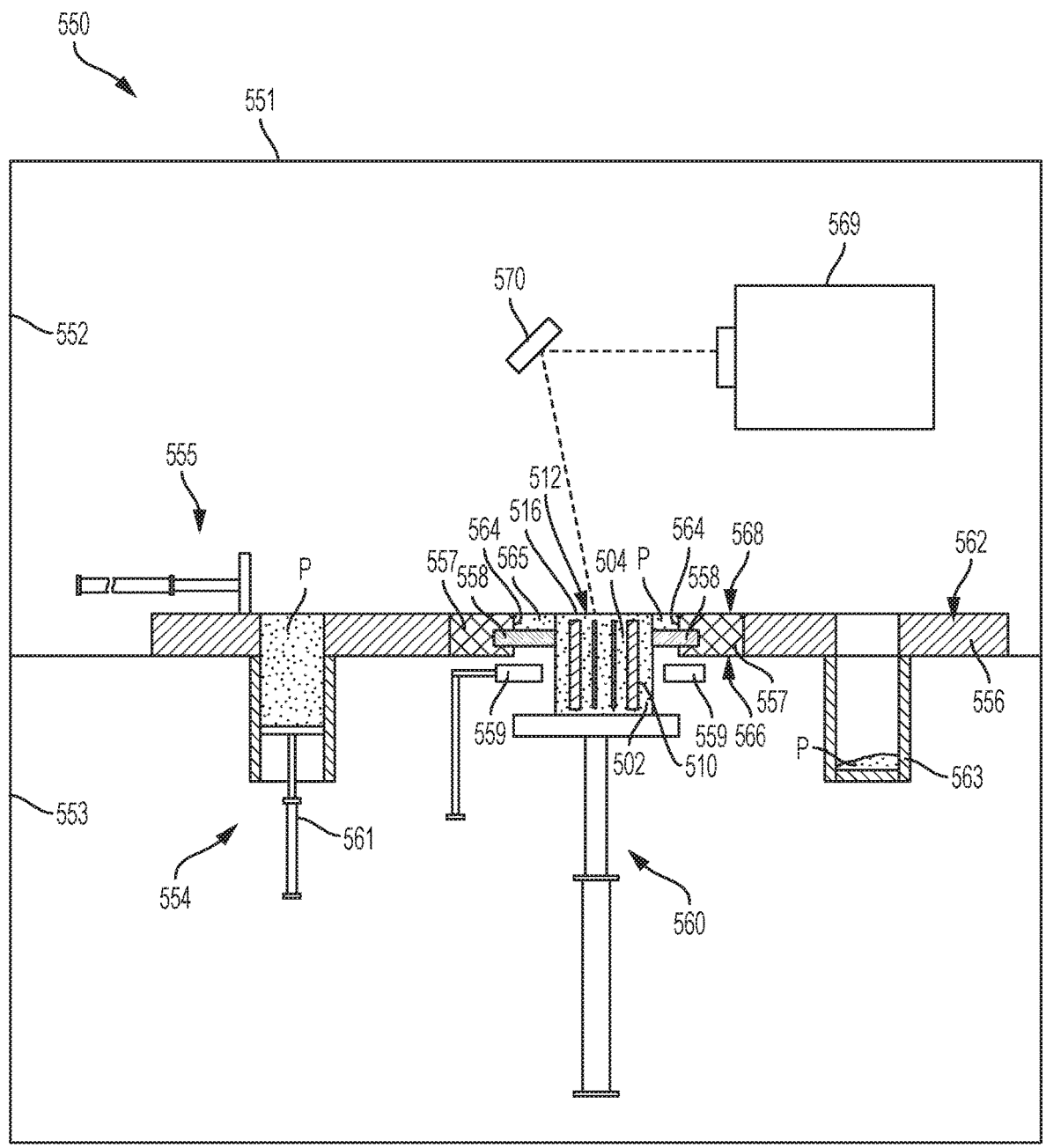
FIG. 5D depicts a DMLM process of manufacturing a blade tip according to an embodiment of the invention, where the apparatus is equipped with an external heat control mechanism.

FIG. 5D shows an embodiment of the DMLM process where the build enclosure 551 includes induction heating at least a portion of the blade tip that is being additively manufactured. The additive manufacturing apparatus 550 includes a build enclosure 551 that encloses, at least partially, components of the apparatus 550. For example, at least a powder bed (not shown) is provided within the build enclosure 551 such that fusion of metallic powder P in the powder bed occurs in a defined environment. In some embodiments, the build enclosure 551 defines an atmosphere that is substantially oxygen-free. In some embodiments, the build enclosure 551 defines an inert atmosphere (e.g., an argon atmosphere). In further embodiments, the build enclosure 551 defines a reducing atmosphere to minimize oxidation. In yet further embodiments, the build enclosure 551 defines a vacuum.

As shown in FIG. 5D, the build enclosure 551 includes a first air-tight zone 552 that defines the environment in which the fusion of metallic powder P in the powder bed occurs. The build enclosure 551 may also include a second zone 553 that may or may not be air-tight, and in one example defines an environment that is in communication with the first zone 552. The apparatus 550 also includes a powder supply mechanism 554, a powder translating mechanism 555, a build platform 556, a work surface 562, a build plate 557, a seal 558, an external heat control mechanism 559 and a component translating mechanism 560. During production, an elevator 561 in the powder supply mechanism 554 lifts a prescribed dose of metallic powder "P" above the level of the build platform 556. The prescribed dose of metallic powder is then spread in a thin, even layer over the work surface 562 and the build surface 512 to form the powder bed 565, by the powder translating mechanism 555. Overflows from the work surface 562 are collected by the excess powder receptacle 563, then optionally treated to sieve out rough particles before re-use.

The build plate 557 includes an aperture 564 extending from the build plate 557. The aperture 564 may be in communication with, and partially form the powder bed 565. As the metallic powder "P" is pushed across the aperture 564 of the build plate 557 by the powder translating mechanism 555, the metallic powder "P" is able to fall through the aperture 564 and into the powder bed 565. In this way, the powder translating mechanism 555 may be operable to deposit the metallic powder "P" through the aperture 564 of the build plate 557 and into the powder bed 565.

Preferably, the build plate 557 is made of a substantially non-conductive material (e.g. ceramic, glass or otherwise non-metallic) that is operable to prevent the external heat control mechanism 559 (which is operable to form a predetermined temperature profile of the intermediate 516) from heating the build plate 557 to a sintering temperature of the metallic powder "P" that is utilized to form layers of the blade tip added to the airfoil 510. In this way, the external heat control mechanism 559 is able to form a predetermined temperature profile of the airfoil 510 and the to-be manufactured tip without interfering with the fusion or sintering of the metallic powder "P" that forms layers of the tip. Preferably, the external heat control mechanism 559 is induction-based, but radiant- or laser-based heating may also be used (e.g. with heat lamp(s) or auxiliary laser).

Figure 5E:
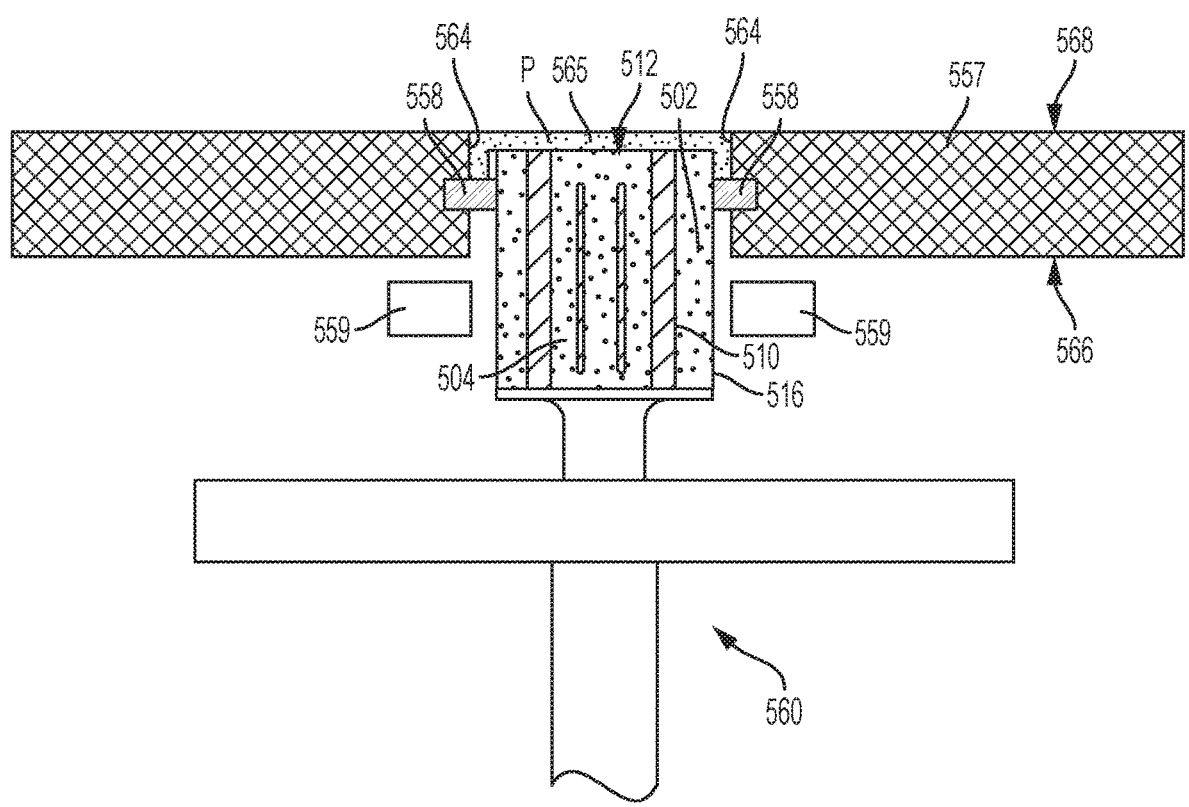
FIG. 5E is an expanded view of the DMLM process of FIG. 5D showing the metal-ceramic intermediate being supported by the component translating mechanism and further secured by seals, and with the external heating mechanisms in proximate positions to the intermediate.

The external heat control mechanism 559 in the example shown in FIGS. 5D and 5E is positioned proximate to the bottom surface 566 of the build plate 557. In some embodiments, as shown in FIG. 5D, the external heat control mechanism 559 may be spaced from the bottom surface 566 of the build plate 557. In an alternative embodiment, the external heat control mechanism 559 may abut the bottom surface 566 of the build plate 557. In yet another alternative embodiment, the external heat mechanism 559 may be positioned in a recess or cavity within the build plate 557. The external heat control mechanism 559 in another unshown example is arranged in a fixed positional relationship with respect to the build plate 557. In yet another example, the external heat control mechanism 559 may be positioned as close as possible to the formation of the new layer on the build surface 512 to control the temperature profile thereof (as explained further herein). For example, the external heat control mechanism 559 may be positioned as close as possible to the bottom surface 566 of the build plate 557. In another embodiment, the external heat control mechanism 559 may be positioned proximate to the bottom surface 566 of the build plate 557 and include soft magnetic material that is configured to concentrate flux toward the build surface 512 to control the temperature profile of the layers formed thereon. As shown in FIGS. 5D and 5E, the external heat control mechanism 559 may form an interior space or void that is substantially aligned with the aperture 564 of the build plate 557 (e.g., in the vertical direction). The intermediate 516 may extend through the interior space or void of the external heat control mechanism 559 and into the aperture 564 of the build plate 557. Stated differently, a portion of the external heat control mechanism 559 may extend at least partially about the intermediate 516. The component translating mechanism 560 may thereby be operable to translate the intermediate 516 with respect to the external heat control mechanism 559 (and the build plate 557).

The external heat control mechanism 559 may be operable to form a predetermined temperature profile of the build surface 512. For example, the external heat control mechanism 559 in one example includes at least one induction coil that substantially surrounds the intermediate 516 when the intermediate 516 is positioned within the aperture 564 of the build plate 557. As the airfoil 510 is conductive and so is the to-be manufactured tip, the at least one induction coil of the external heat control mechanism 559 is able to control the temperature of the intermediate 516 and the tip as electric current is passed through the coil and a magnetic field is created. Further, as the external heat control mechanism 559 is positioned proximate to the bottom surface 566 of the build plate 557, the external heat control mechanism 559 is capable of controlling the temperature of the build surface 512 to ensure that the layers of the blade tip formed by the metallic powder "P" are not cracked. In this way, the external heat control mechanism 559 is operable to form a predetermined temperature profile of the build surface 512 to prevent cracking of the blade tip.

In one example, a predetermined temperature profile is generated of at least one newly, additively formed layer from the sintering or fusion temperature of the at least one layer to the solidification temperature thereof (e.g., about 1300° C., depending upon the composition of the metal alloy powder "P") such that, at least upon solidification, the at least one layer is crack-free. The predetermined temperature profile of a newly formed layer, such as a predetermined cooling profile from the sintering or fusion temperature to the solidification temperature thereof, that results in the solidified layer being crack free may be empirically determined, experimentally determined or a combination thereof. In some embodiments, the predetermined temperature profile may be a range of predetermined cooling profiles of at least one newly and additively formed layer from the sintering or fusion temperature to the solidification temperature thereof such that, at least upon solidification, the at least one layer is crack-free. A particular temperature profile made from at least one newly and additively formed layer that is effective in preventing cracks in the at least one layer at least upon solidification may be influenced or depend (at least in part) by a number of factors, such the composition of the metallic powder "P", the thickness of the at least one layer, the shape/configuration of the at least one layer, the initial temperature of the at least one layer (i.e., the fusion temperature), the solidification temperature of the at least one layer, the temperature gradient between the at least one layer and the preceding and/or subsequent layer or formed portion, the desired microstructure of the at least one layer after solidification, the ultimate operating parameter of the additively manufactured tip, the desired speed of the formation of the at least one layer (i.e., the movement of the component by the component translating mechanism 560), etc. In one example, the apparatus 550 forms or applies the predetermined temperature profile to an end portion of the airfoil 510 (e.g., to at least one newly formed layer), such as a cooling profile from fusion to solidification, by use of at least the external heat control mechanism 559 and the component translating mechanism 560 (to translate the intermediate 516 with respect to the external heat control mechanism 559).

The predetermined temperature profile is typically greater than ambient temperature and less than a temperature required to melt the deposited material, i.e. 200-1200° C., preferably 500-1200° C., more preferably 1000-1200° C. In one embodiment, the external heat control mechanism sustains the temperature during the DMLM at about 1000° C. Heating at such a temperature promotes growth of the crystalline grains formed in the blade tip, thereby allowing multiple ultra-thin additive layers (~20-100 µm thick) to be formed that in turn, result in a blade tip having improved feature resolution. In addition, heating to such temperatures avoids cracking of the deposit, which occurs at lower temperatures.

As shown in FIG. 5D, a method of manufacturing a blade tip with the apparatus 550 includes translating the blade tip, such as via the component translating mechanism 560, with respect to the build plate 557 such that the build surface 512 of the intermediate 516 positioned within the aperture 564 (potentially below the top surface 568 of the build plate 557) and in engagement with the seal 558. The aperture 564 of the build plate 557, the seal 558 and the build surface 512 may cooperate to form the powder bed 565 for holding the metallic powder "P". During such a condition, the powder supply mechanism 554 may expose metallic powder "P", as also shown in FIG. 5D. With metallic powder "P" exposed, the powder translating mechanism 555 may then fill the powder bed 565 by depositing the exposed metallic powder "P" through the aperture 564 and over the seal 558 and the build surface 512. The powder bed 565 may thereby form a layer of metallic powder "P" over or on the build surface 512. As noted above, in one example, the thickness of the layer of metallic powder "P" over or on the end portion 64 of the component "C" is within the range of 30-50 µm.

Once metallic powder "P" is deposited within the powder bed 565 and a layer of metallic powder "P" is thereby formed over or on the build surface 512, as shown in FIG. 5D the directed energy source 569 and the beam directing mechanism 570 may direct a beam of energy to the layer of deposited metallic powder "P" in a pattern to fuse the metallic powder "P" to the build surface 512 as a new cross-sectional layer. After the new cross-sectional layer is formed on the build surface 512, the external heat control mechanism 559 is used to form a temperature profile of at least the newly formed cross-sectional layer to prevent cracking. Also after the new cross-sectional layer is formed on the build surface 512, and potentially during or part of the formation of the temperature profile of at least the newly formed cross-sectional layer, the blade tip (not shown in FIG. 5D) may be translated with respect to the build plate 557 and the external heat control mechanism 559 by the component translating mechanism 560. The blade tip may be translated to a lower position in the powder bed 565 such that the build surface 512 with the newly formed layer is positioned within the aperture 564 (potentially below the top surface 568) and in engagement with the seal 558. The build surface 512 may then be in a condition for deposition and fusion of metallic powder "P" in the powder bed 565 to form another layer thereon. In this way, translating the blade tip, depositing the metallic powder "P", fusing the metal powder "P" layer on the build surface 512 of the metal-ceramic intermediate 516, and forming the temperature profile may form a cycle that may be performed a plurality of times to manufacture or form the metallic blade tip in a cross-sectional layer by cross-sectional layer fashion.

The beam directing mechanism 570 moves or scans the focal point of an unfocused laser or electron beam emitted by the directed energy source 569 across the build surface 512 during the DMLM processes. The beam directing mechanism 570 in DMLM processes is typically of a fixed position but the optical (e.g. telecentric lenses, mirrors, beam splitters) or electronic (e.g. deflector coils, focusing coils) contained therein may be movable in order to allow various properties of the laser beam to be controlled and adjusted. However, in some embodiments the beam directing mechanism 570 itself may be moved to different positions for such adjustments. The speed at which the laser is scanned is a critical controllable process parameter, impacting how long the laser power is applied to a particular spot. Typical laser scan speeds are on the order of 10 s to 100 s of millimeters per second.

In certain embodiments the directed energy source 569 is a diode fiber laser array (e.g. a diode laser bar or stack) that includes a plurality of diode lasers or emitters that each emit a beam of radiation. A cylindrical lens may be positioned between the diode lasers and a plurality of optical fibers. The cylindrical lens compensates for the high angular divergence in the direction perpendicular to the diode junction of the lasers, typically reducing the beam divergence in the fast axis to less than that of the slow axis, thereby easing the assembly tolerances of the overall system compared to an assembly which does not use any coupling optics (i.e., one in which each fiber is simply placed in close proximity to the laser to which it is to be coupled). However, it should be appreciated that diode fiber laser arrays that do not use coupling optics may be used with the present technology. In certain embodiments, the plurality of optical fibers may further includes lenses at their respective ends that are configured to provide collimated or divergent laser beams from the optical fibers. It should also be appreciated that even in the absence of these lenses, the ends of the optical fibers 109 may be adapted to provide collimated or divergent laser beams.

As an alternative to induction heating, the DMLM process of the present invention may be equipped with radiant heating, where at least a portion of the blade tip that is being additively manufactured and a retaining wall that defines a build chamber are heated to a desired temperature, such as the additive manufacturing processes disclosed in U.S. Patent Application No. 2013/0101746 (currently assigned to Aeroj et Rocketdyne, Inc.), which is incorporated herein by reference in its entirety. A plurality of heating elements may be mounted or supported upon the retaining wall. Preferably, at least the additively manufactured blade tip and the retaining wall proximal to the unfocused irradiation beam are radiantly heated. More preferably, the blade tip and the entirety of the workspace within the build chamber are subject to radiant heating. The heating elements generate a radiant heat that maintains the entire workspace at a desired temperature. The desired temperature is typically greater than ambient temperature and less than a temperature required to melt the deposited material.

The DMLM apparatuses and methods described above may be used to construct all or part of the blade tip, potentially in combination with other methods. For example, to construct all of blade tip via the apparatus 550 and methods described above, a seed component may initially be utilized for the formation of a first layer thereon. In other embodiments, to construct part of the blade tip via the apparatus 550 and methods described above the layers may be formed on a pre-existing partially formed tip.

Figure 5F:
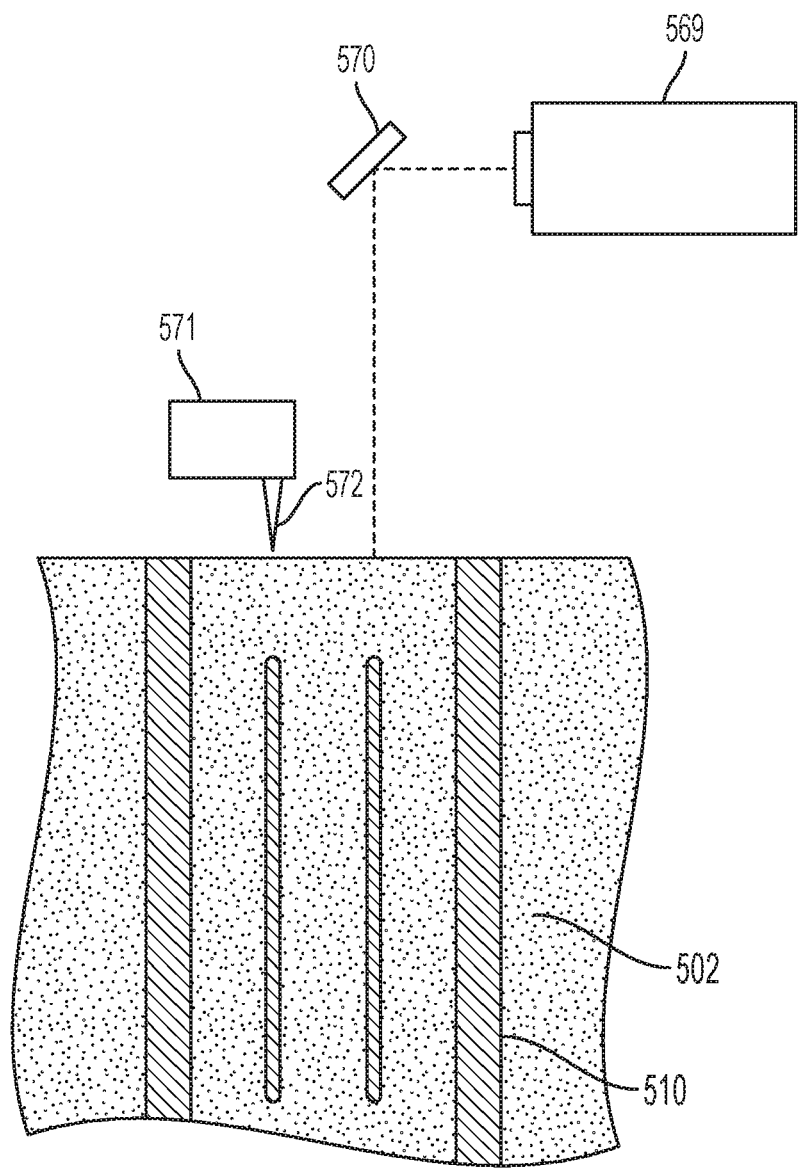
FIG. 5F depicts a DMLM process of manufacturing blade tip according to an embodiment of the invention, where the DMLM system is equipped with a direct ink write (DIW) lithography system for deposition of ceramic slurry.

In one particular embodiment, a DMLM apparatus or system in accordance with the present invention (with or without induction/radiant heating) may be combined with another additive manufacturing system and technique, namely the direct ink writing (DIW), which is also known as "robocasting", for computer-controlled deposition of ceramic slurry. As illustrated in FIG. 5F, a DIW robot or system 571 (represented schematically) extrudes or squeezes a filament of "ink", which in this case is ceramic slurry, from a nozzle or syringe 572 to form a ceramic part layer by layer (the extruded ceramic slurry eventually dries and solidifies). The DIW process may be utilized, for example, to re-form the ceramic core and/or ceramic shell, or to refine the build surface 512 after the machining step. However, it should be noted that the present invention is not restricted to DIW and that any suitable computer-controlled ceramic additive manufacturing technique may be used in combination with DMLM.

It is shown in FIGS. 5A-5D that the ceramic outer shell 502 remains attached to the airfoil 510 after the casting process and even during the subsequent additive manufacturing of the blade tip. The shell may be alternatively removed after the casting is complete and prior to the manufacturing of the tip (core retained). However, retaining the shell may provide additional advantages, such as providing improved visual contrast to the step of removing a portion of the airfoil 510-ceramic casting mold 500 combination to create the build surface 512. Visual contrast improves automated recognition and registration of the blade tip. A robot can find each (slightly different) blade tip and adjust the DMLM program accordingly. The retained shell can also provide uniform heating or insulation of the parent airfoil 510 during a heated DMLM process, which promotes crystalline grain growth.

Prior to any of the additive manufacturing processes described herein, the ceramic-metal build surface may be treated for ceramic contamination, e.g. by vacuuming, chemical treatment with an alkaline media, or with a protective layer covering the build surface or a combination of two or more of these, which promotes clean bonding of the additive metal to the cast parent airfoil.

The ceramic cores of the present invention may incorporate special design features, for example one or more witness features. In some embodiments, the witness feature is embedded in the ceramic core in such a way that only one surface of the witness feature is shown without the feature sticking out from the core surface. In other words, the witness feature is co-planar with the core surface. Alternatively, the witness feature forms a notch protruding from the core surface. In certain embodiments, the witness feature is made of a material other than ceramic. In other embodiments, the witness feature, like the core, is also made of ceramic, which together with the core may be additively manufactured, e.g. using one or more of the techniques disclosed in the Applicant's co-pending application Ser. Nos. 15/377,673; 15/377,796; 15/377,728; 15/377,759; 15/377,787; 15/377,746; 15/377,766; and Ser. No. 15/377,783. The disclosures of each of these applications are incorporated here by reference in their entireties. Alternatively, the notch witness feature and the ceramic casting mold are manufactured using the technique selective laser activation (SLA). For example, the notch may be formed in the SLA metallic mold that is later used to form the wax core.

Figure 6A:
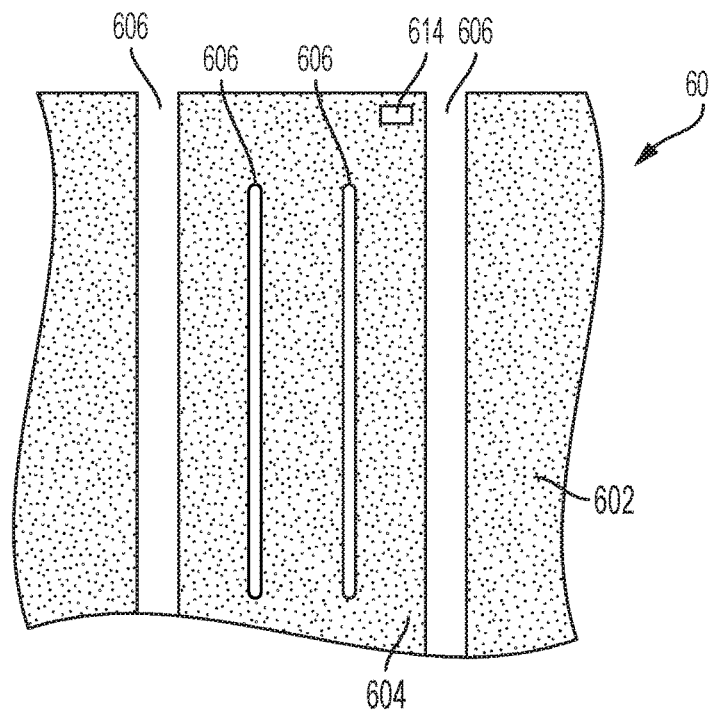
FIG. 6A shows a ceramic casting mold having an external shell and an internal core with one or more inner cavities between the shell and the core according to an embodiment of the invention, where the core has an embedded witness feature.
Figure 6B:
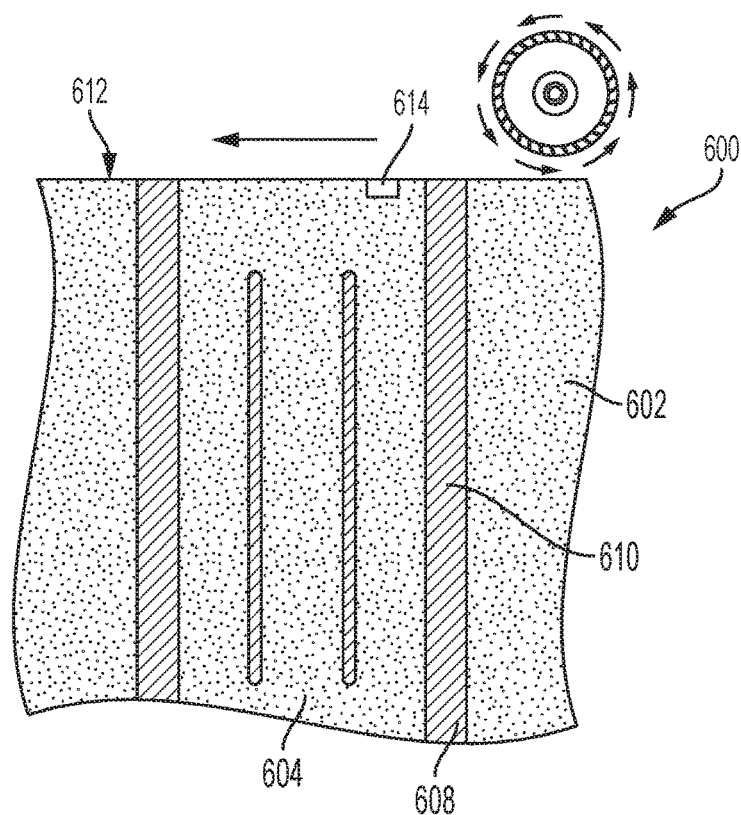
FIG. 6B shows the ceramic casting mold of FIG. 6A (filled with liquid metal) being ground until the witness feature is exposed.

FIG. 6A shows a ceramic casting mold 600 that includes an outer shell 602 and an inner core 604 that define one or more inner cavities 606. The inner core 604 further includes a witness feature 614. After the inner cavities 606 are filled with a liquid metal 608 to form an airfoil 610, a portion of the airfoil 610-ceramic casting mold 600 is removed until the witness feature 614 is exposed (see, FIG. 6B). Alternatively, a portion of the airfoil 610-ceramic casting mold 600 is removed until the witness feature 614 is exposed and also removed. Yet alternatively, a portion of the airfoil 610-ceramic casting mold 600 is removed quickly and when the witness feature 614 is exposed, the removal process is slowed down and the witness feature 614 helps to determine how much more of the airfoil 610-ceramic casting mold 600 needs to be removed. In that way, having one or more witness features in the ceramic core enables a repeatable location of the first additive plane.

Figure 7A:
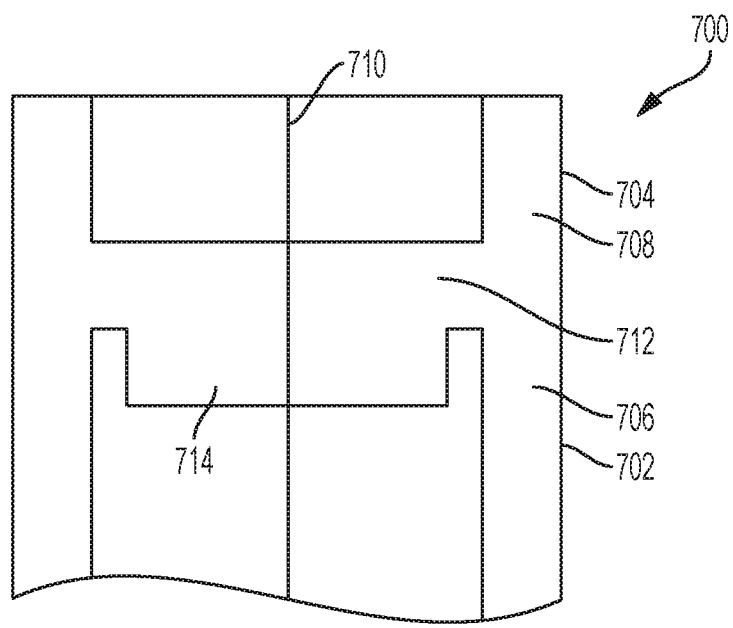
FIG. 7A is a cutaway view of a turbine blade (with the aft side of the blade looking forward) having a plurality of turbulators oriented circumferentially.
Figure 7B:
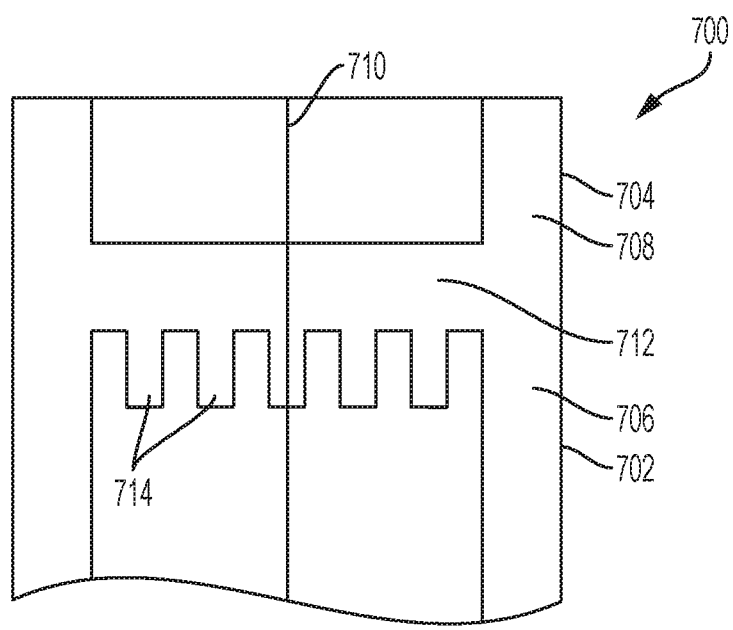
FIG. 7B is a cutaway view of a turbine blade (with the aft side of the blade looking forward) having a plurality of turbulators oriented axially.

In another embodiment, ceramic cores of the present invention include features that, upon removal of the core, correspond to a plurality of turbulators being formed at the underside of the tip cap. These as-cast turbulators promote and/or increase heat transfer between the heated sidewalls of the airfoil and the internal cooling air. FIGS. 7A and 7B present a cutaway view of a partial turbine blade 700 with the aft side of the blade looking forward, showing the airfoil 702, airfoil outer wall 706, trailing edge 710, tip 704 and tip wall 708. The airfoil 702 and the tip 704 are separated by the tip cap 712 that has a plurality of turbulators 714 oriented circumferentially (FIG. 7A) or axially (FIG. 7B).

In an alternative embodiment, the tip cap having a series of heat-transferring turbulators as described above is additively manufactured rather than cast.

Yet other specific features or contouring may be incorporated in the ceramic core design of the present invention, including but not necessarily limited to integrated ceramic filaments between the core and shell of the mold that can be utilized to form holes, i.e., effusion cooling holes, in the cast component made from these molds. The use of sufficient ceramic filaments between core and shell to both locate and provide leaching pathways for the core serpentine also enables the elimination of ball braze chutes. Ceramic filaments between the tip plenum core and the shell may also be provided to support a floating tip plenum, eliminating the need for traditional tip pins, and their subsequent closure by brazing.

Figure 8A:
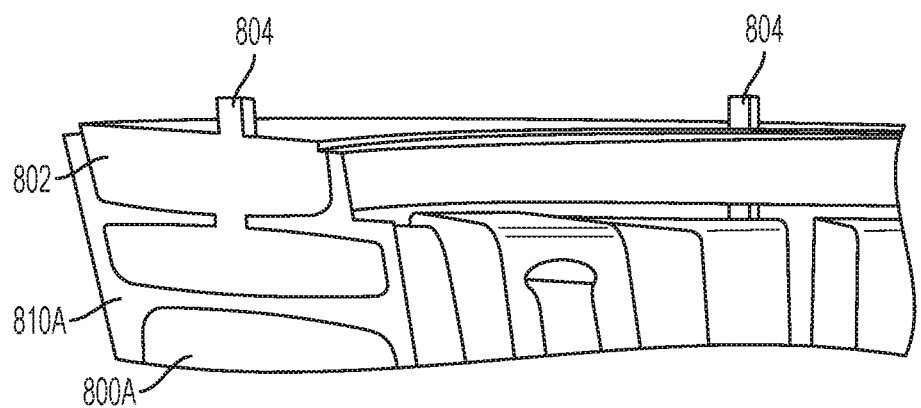
FIG. 8A presents a prior art ceramic casting mold having a tip plenum core and tip pins.
Figure 8B:
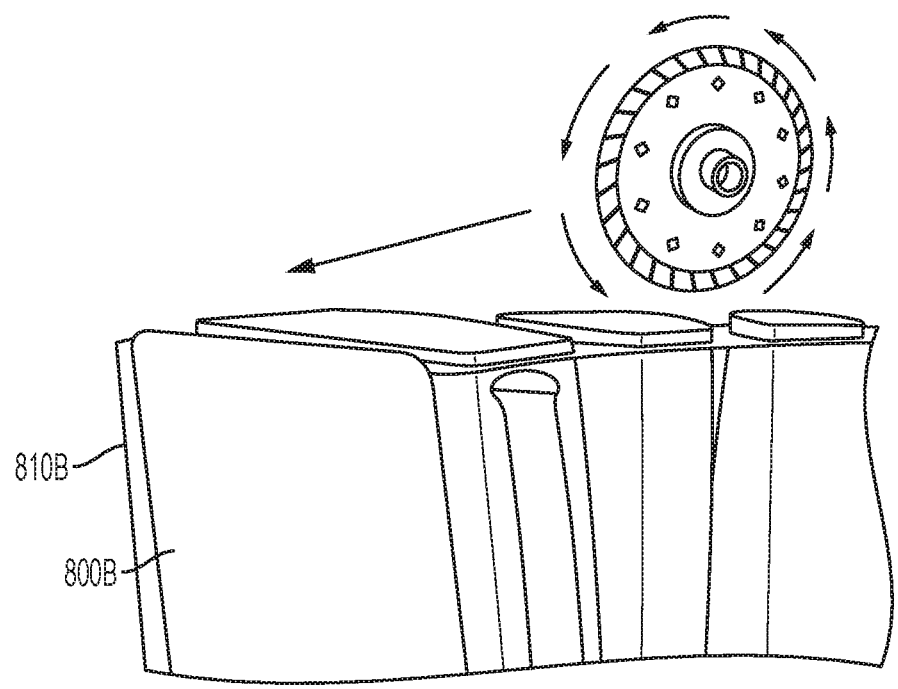
FIG. 8B presents a ceramic casting mold having an open tip casting according to an embodiment of the present invention.

Conventional ceramic cores, like the core 800A shown in FIG. 8A, include a tip plenum 802 having tip pins 804 which upon leaching form tip holes within the cast airfoil 810A that must subsequently be brazed shut. In the present invention, ceramic cores with an open tip casting (i.e. tip plenum and tip pins eliminated) such as the core 800B of FIG. 8B may be provided. The open tip design results in improved control of the airfoil wall (e.g. thickness), faster and easier leaching of the ceramic core and eliminates the need for brazing. As shown in FIG. 8B, after molten metal is poured into the ceramic core 800B, cooled and solidified to form a cast airfoil 810B, a portion at the top of the ceramic core 800B may be removed to create a planar surface for subsequent DMLM manufacturing of the blade tip.

The blade tips of the present invention may incorporate one or more holes formed thereon during the additive manufacturing process. The ceramic core may be leached through these holes.

Figure 9A:
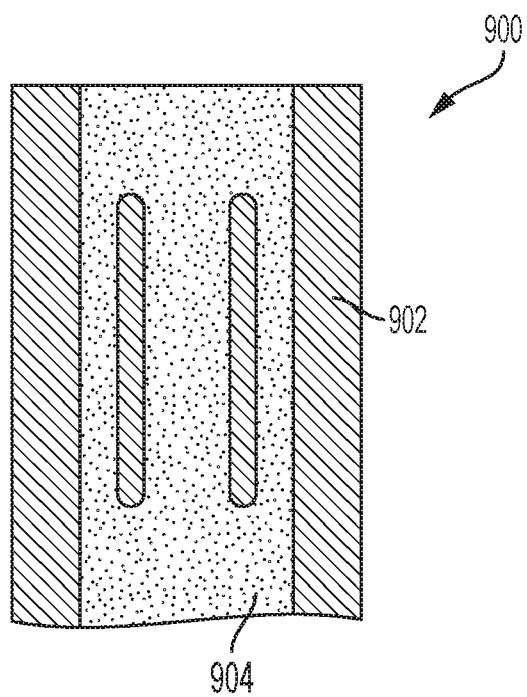
FIG. 9A shows a field-return turbine blade with a damaged tip.
Figure 9B:
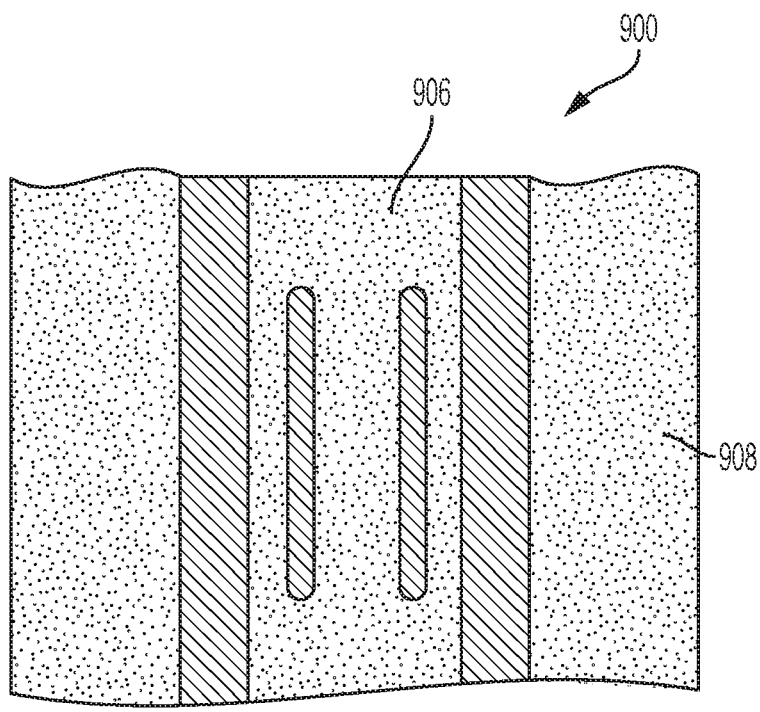
FIG. 9B shows restoration of the internal ceramic core and optionally the external shell by injection of a ceramic slurry into the hollow field-return turbine blade of FIG. 9A.

FIG. 9 depicts a method of repairing a field-return turbine blade with a damaged tip in accordance with the present invention. A field-return airfoil 900 having an outer wall 902 and inner void 904 is provided in FIG. 9A. A ceramic slurry is injected into the void 904, which then hardens to re-form the internal ceramic core 906. In certain embodiments, the external ceramic shell 908 enveloping the entire blade 900 may also be re-formed. Subsequent steps in the repair are similar to those described in the new-cast turbine blade manufacturing methods, i.e. removal of the top portion of the airfoil and the core to reveal a build surface and additive manufacturing of a replacement blade tip.

Figure 10:
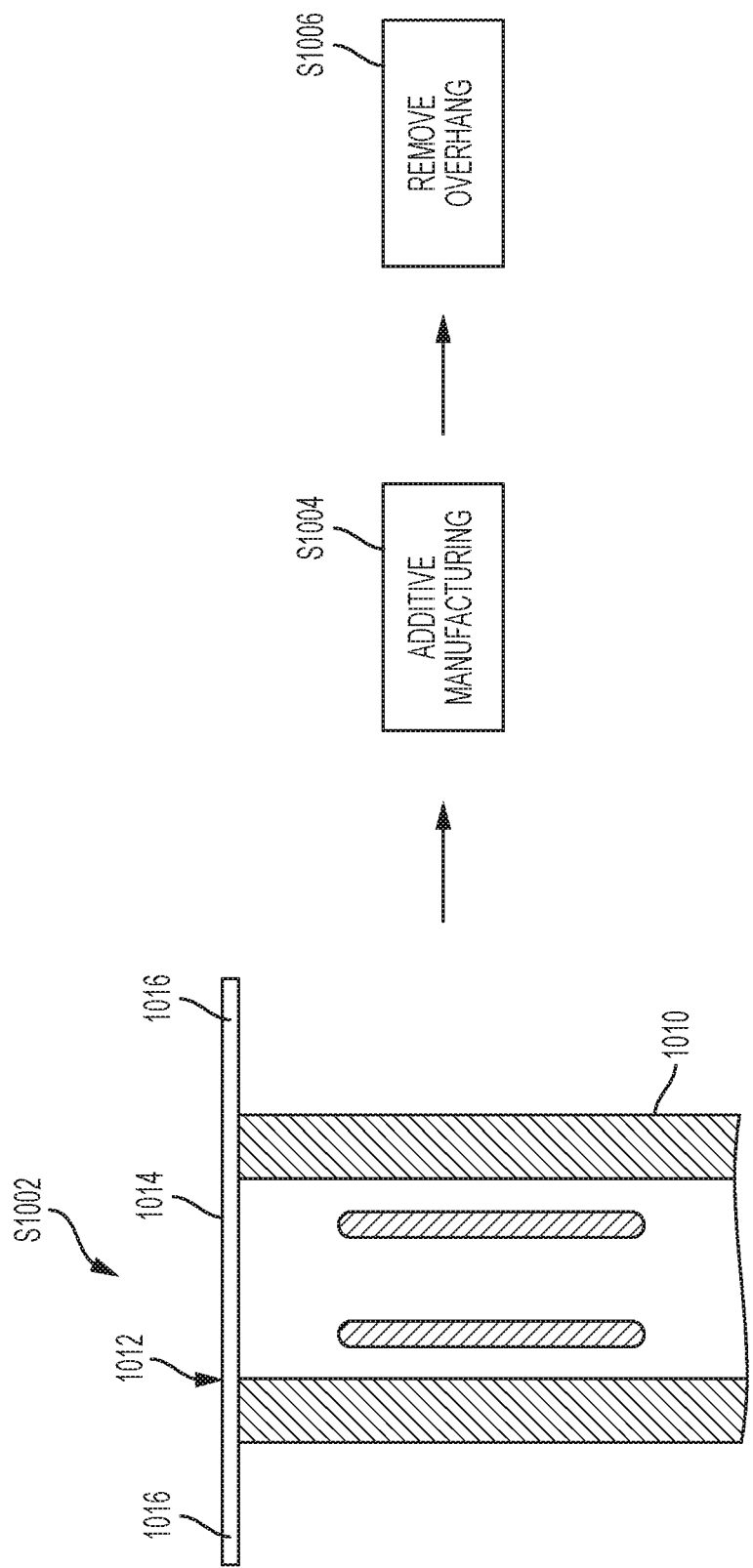
FIG. 10 depicts a method of repairing a field-return turbine blade according to an embodiment of the present invention.

In yet another aspect, the present invention provides an alternative method of repairing a field-return turbine blade with a damaged tip that does not utilize a ceramic-metal build surface for the additive manufacturing of a replacement tip. Referring to FIG. 10, an ultra-thin shim 1012 is placed on top of the damaged blade tip or the airfoil 1010 at step S1002, which offers a flat or planar surface 1014 to support the subsequent additive manufacturing of a new or replacement blade tip at step S1004 (with optional induction or radiant heating as disclosed herein). In some embodiments, a ceramic core and/or a ceramic shell (not shown in FIG. 10) may be present prior to the additive manufacturing of the blade tip.

The ultra-thin shim 1012 is preferably made of the same material as the metallic powder used to additively manufacture the blade tip. Importantly, due to its thickness of merely less than 1000 μm, for example 25-900 μm (0.025-0.9 mm), preferably 200-750 μm (0.02-0.75 mm) and more preferably 250-500 μm (0.25-0.5 mm), the ultra-thin shim 1012 can be more readily and more easily joined to the outer wall of the airfoil 1010 compared to the thin plate 50 and the shim 50' disclosed in the earlier-referenced U.S. Patent Application Publication No. 2010/0200189. The joining may be done using the same processes described herein. Also importantly, the ultra-thin shim 1012 is not limited by its geometrical shape, but preferably it fully covers the outer walls of the airfoil 1010 to form a continuous and sealed support surface with one or more overhangs 1016 for the additive manufacturing of the blade tip. The overhang(s) 1016 is subsequently removed at step S1006, for example, by machining or grinding or any other known equivalent technique.

In an aspect, the present invention relates to the manufacturing methods of the present invention incorporated or combined with features of other manufacturing methods, apparatuses and ceramic core-shell molds. The following patent applications include disclosure of these various aspects of these methods and molds:

U.S. patent application Ser. No. 15/406,467, titled "Additive Manufacturing Using a Mobile Build Volume,", and filed Jan. 13, 2017.

U.S. patent application Ser. No. 15/406,454, titled "Additive Manufacturing Using a Mobile Scan Area,", and filed Jan. 13, 2017.

U.S. patent application Ser. No. 15/406,444, titled "Additive Manufacturing Using a Dynamically Grown Build Envelope,", and filed Jan. 13, 2017.

U.S. patent application Ser. No. 15/406,461, titled "Additive Manufacturing Using a Selective Recoater,", and filed Jan. 13, 2017.

U.S. patent application Ser. No. 15/406,471, titled "Large Scale Additive Machine,", and filed Jan. 13, 2017.

U.S. patent application Ser. No. 15/439,592 titled "METHOD OF REPAIRING TURBINE COMPONENT", and filed Feb. 22, 2017;

U.S. patent application Ser. No. 15/439,529, titled "METHOD OF MANUFACTURING TURBINE AIRFOIL WITH OPEN TIP CASTING AND TIP COMPONENT THEREOF", and filed Feb. 22, 2017;

U.S. patent application Ser. No. 15/439,548, titled "METHOD OF MANUFACTURING TURBINE BLADE TIP", and filed Feb. 22, 2017;

U.S. patent application Ser. No. 15/439,451, titled "METHOD OF MANUFACTURING TURBINE AIRFOIL AND TIP COMPONENT THEREOF USING CERAMIC CORE WITH WITNESS FEATURE", and filed Feb. 22, 2017; and U.S. patent application Ser. No. 15/439,584, titled "METHOD OF MANUFACTURING REPAIRING TURBINE AIRFOIL AND TIP COMPONENT THEREOF", and filed Feb. 22, 2017.

The disclosures of each of these applications are incorporated herein in their entireties to the extent they disclose additional aspects of core-shell molds and methods of manufacturing that can be used in conjunction with the core-shell molds disclosed herein.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

The invention claimed is:

1. A method of manufacturing a metal object, comprising:
  a) placing a plate on top of a cast component, wherein the plate covers a cavity within the cast component and creates an overhang on the top of the cast component;
  b) depositing, by a powder translating mechanism, a layer of metallic powder onto a support surface formed by the plate including the overhang to form a powder bed;
  c) irradiating at least a portion of the metallic powder to form a fused layer by scanning a focal point of a beam emitted by a directed energy source across the powder bed;

d) repeating steps (b)-(c) until the metal object is formed; and
e) removing the overhang,
wherein the irradiation at step (c) joins the plate to the cast component.

2. The method according to claim 1, wherein the metal object is a turbine component.

3. The method according to claim 2, wherein the turbine component is a blade.

4. The method according to claim 2, wherein the turbine component is a vane.

5. The method according to claim 1, wherein the support surface is planar.

6. The method according to claim 1, wherein the plate has a thickness of 25-900 µm.

7. The method according to claim 1, wherein the method is a process of repairing the metal object.

8. The method according to claim 1, wherein steps (c)-(e) are carried out in the presence of induction heating, radiant heating or a combination of both.

9. The method according to claim 1, wherein the cast component is an airfoil.

10. The method according to claim 1, wherein the overhang is removed by machining.

11. A method of manufacturing a turbine blade or vane, comprising;
a) placing a plate on top of a cast component, wherein the plate covers a cavity within the cast component and creates an overhang on the top of the cast component;
b) depositing, by a powder translating mechanism, a layer of metallic powder onto a support surface formed by the plate including the overhang to form a powder bed;
c) irradiating at least a portion of the metallic powder to form a fused layer by scanning a focal point of a beam emitted by a directed energy source across the powder bed;
d) repeating steps (b)-(c) until the blade or vane is formed; and
e) removing the overhang,
wherein the irradiation at step (c) joins the plate to the cast component.

12. The method according to claim 11, wherein the overhang is removed by machining.

13. The method according to claim 11, wherein the cast component is an airfoil.

14. The method according to claim 11, wherein the support surface is planar.

15. The method according to claim 11, wherein the plate has a thickness of 25-900 µm.

16. The method according to claim 11, wherein the method is a process of repairing the blade or vane.

17. The method according to claim 11, wherein steps (c)-(e) are carried out in the presence of radiant heating.

18. The method according to claim 13, wherein the airfoil has a single crystal structure.

* * * * *